(12) United States Patent
Mori

(10) Patent No.: US 6,903,801 B2
(45) Date of Patent: Jun. 7, 2005

(54) ILLUMINATION OPTICAL SYSTEM FOR USE IN PROJECTION EXPOSURE APPARATUS

(75) Inventor: Kenichiro Mori, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/823,973

(22) Filed: Apr. 3, 2001

(65) Prior Publication Data

US 2001/0043318 A1 Nov. 22, 2001

(30) Foreign Application Priority Data

Apr. 3, 2000 (JP) ........................................ 2000-100328

(51) Int. Cl.$^7$ ........................ G03B 27/54; G03B 27/42; G03B 27/72; G03B 27/32
(52) U.S. Cl. .............................. 355/67; 355/53; 355/71; 355/77
(58) Field of Search .............................. 355/77, 67, 71, 355/52, 53

(56) References Cited

U.S. PATENT DOCUMENTS

| | | | | |
|---|---|---|---|---|
| 4,851,978 A | * | 7/1989 | Ichihara | 355/67 |
| 4,918,583 A | * | 4/1990 | Kudo et al. | 359/619 |
| 5,305,054 A | | 4/1994 | Suzuki et al. | 355/53 |
| 5,345,292 A | * | 9/1994 | Shiozawa et al. | 355/67 |
| 5,659,429 A | * | 8/1997 | Kudo | 359/727 |
| 5,673,102 A | | 9/1997 | Suzuki et al. | 355/53 |
| 5,675,401 A | * | 10/1997 | Wangler et al. | 355/67 |
| 6,040,894 A | * | 3/2000 | Takahashi | 355/53 |
| 6,084,655 A | | 7/2000 | Suzuki et al. | 355/53 |
| 6,128,068 A | | 10/2000 | Suzuki et al. | 355/53 |
| 6,211,944 B1 | * | 4/2001 | Shiraishi | 355/53 |
| 6,259,512 B1 | | 7/2001 | Mizouchi | 355/67 |
| 6,285,443 B1 | * | 9/2001 | Wangler et al. | 355/67 |
| 6,392,742 B1 | * | 5/2002 | Tsuji | 250/492.2 |

FOREIGN PATENT DOCUMENTS

| | | |
|---|---|---|
| JP | 4-267515 | 9/1992 |
| JP | 5-21312 | 1/1993 |
| JP | 7-201697 | 8/1995 |
| JP | 9-219358 | 8/1997 |
| JP | 11-54426 | 2/1999 |
| JP | 11-176721 | 7/1999 |

* cited by examiner

*Primary Examiner*—Alan Mathews
(74) *Attorney, Agent, or Firm*—Fitzpatrick, Cella, Harper & Scinto

(57) ABSTRACT

Disclosed is an illumination optical system for illuminating a surface, to be illuminated, with use of light from a light source, which includes a diffractive optical element for forming a desired light intensity distribution upon a predetermined plane, and an angular distribution transforming unit for transforming an angular distribution of light incident or to be incident on the diffractive optical element into a desired distribution.

18 Claims, 7 Drawing Sheets

ILLUMINATION OPTICAL SYSTEM FOR USE IN PROJECTION EXPOSURE APPARATUS

FIELD OF THE INVENTION AND RELATED ART

This invention relates to an illumination optical system, a projection exposure apparatus having the same, and a device manufacturing method using such an exposure apparatus. More particularly, the invention concerns an illumination optical system suitably usable in a projection exposure apparatus for use in a projection exposure process during lithographic processes, for the manufacture of semiconductor devices, liquid crystal devices, image pickup devices (e.g., CCDs), or thin film magnetic heads, for example.

In order to meet miniaturization of semiconductor devices, many super resolution technologies have been developed to obtain resolution finer than the wavelength of a light source used in a projection exposure apparatus.

An example is a modified or deformed illumination method (oblique incidence illumination method), as disclosed in Japanese Laid-Open Patent Application, Laid-Open No. 21312/1993 and Laid-Open NO. 267515/1992, and corresponding U.S. Pat. No. 5,305,054, No. 5,673,102, No. 6,084,655, and No. 6,128,068.

The deformed illumination method is that the illumination light for illuminating a mask does not have a uniform angular distribution, and the illumination light is obliquely incident on the mask. In this method, the angular distribution of light for illuminating the mask surface corresponds to the position distribution of a pupil plane (Fourier transform plane) with respect to the mask surface (object plane). Therefore, in a projection exposure apparatus having a fly's eye lens as disclosed in Japanese Laid-Open Patent Application, Laid-Open No. 21312/1993, mentioned above, for example, the light intensity distribution at the light exit surface of the fly's eye lens should be low on the optical axis. For example, in this document, the light intensity distribution at the light exit surface of the fly's eye lens has a ring-like shape. In Japanese Laid-Open Patent Application, Laid-Open No. 267515/1992, it has a quadrupole shape. Here, the light intensity distribution at the pupil position with respect to the mask surface is called an "effective light source".

Since the light intensity distribution of the light from a light source upon the pupil plane is an axially symmetrical Gaussian distribution, a light intensity transforming optical system is necessary to transform the light intensity distribution on the pupil plane into a ring-like shape or a quadrupole shape.

A simplest optical system for transforming the light intensity distribution is placing a ring-like or quadrupole aperture stop at the light exit surface of an optical integrator. With this method, however, only a portion of light from a light source is extracted and, therefore, light is eclipsed. Thus, light from a light source cannot be used efficiently, and the illuminance on the mask surface (surface to be illuminated) is low.

Many proposals have been made to accomplish the deformed illumination method without decreasing the light utilization efficiency. Japanese Laid-Open Patent Applications, Laid-Open NO. 219358/1997 and No. 54426/1999, show an example which uses a prism, to increase the light utilization efficiency. In Japanese Laid-Open Patent Application, Laid-Open No. 219358/1997, a prism is disposed at a position which is in pupil relation with the light entrance surface of a fly's eye lens, to thereby transform the light intensity distribution. In Japanese Laid-Open Patent Application, Laid-Open No. 54426/1999, a prism is disposed at a position which is in an optically conjugate relation with the light entrance surface of a fly's eye lens, thereby to transform the light intensity distribution at the light entrance surface of the fly's eye lens and, thus, that upon the exit surface thereof.

In order that a light intensity distribution is transformed efficiently by use of a prism, the angular distribution of light incident on the prism should not be extended. However, according to the optical law, at a place where the angular distribution is not extended, the positional distribution there is extended inversely. For this reason, in order to accomplish transformation of the light intensity distribution with a conventional structure, use of a bulky prism is necessary, and also, a large turret for changer is required.

Japanese Laid-Open Patent Application, Laid-Open No. 201697/1995, proposes a method of transforming a light intensity distribution on the light entrance surface of a fly's eye lens by use of a diffractive optical element. Also, in the case of diffractive optical elements, for efficient transformation of light intensity distribution, the angular distribution of light incident on the diffractive optical element should not be extended. However, in the case of diffractive optical elements, as compared with prisms, since it is a flat plate, enlargement of the diameter thereof does not lead to bulkiness.

However, in the case of diffractive optical element called a binary optical element (BOE), having a stepped structure of finite levels formed on its surface, zero-th order light is necessarily produced. Therefore, when such a diffractive optical element is used, there is produced a desired light intensity distribution plus a distribution of zero-th order light. Thus, a desired distribution cannot be accomplished by transform.

As regards the intensity of zero-th order light, it may be about 59% with a diffractive optical element having a two-level step structure, and it may be about 19% even with a diffractive optical element having a four-level step structure. It is not an intensity that can be neglected.

Further, in Japanese Laid-Open Patent Application, Laid-Open No. 201697/1995, only by use of a diffractive optical element, the light intensity distribution on the light entrance surface of a fly's eye lens is transformed. This means that plural diffractive optical elements, or a number corresponding to the types of desired light intensity distributions to be produced, should be prepared.

Recent projection exposure apparatuses are arranged so that a few types of deformed illumination modes such as having effective light source shapes of quadrupole (FIG. 3A), ½ ring (FIG. 3B) and ⅔ ring (FIG. 3C), for example, as well as a few types of standard illumination modes such as a large σ (FIG. 3D) and a small σ (FIG. 3E), can be accomplished in one and the same projection exposure apparatus. Here, in FIGS. 3A–3E, portions painted by black correspond to regions in which the light intensity distribution is zero. If, therefore, the method disclosed in Japanese Laid-Open Patent Application, Laid-Open No. 201697/1995 mentioned above is used to meed this requirement, diffractive optical elements of the same number as of the illumination modes must be prepared, and they must be arranged interchangeably.

Since a diffractive optical element is produced on the basis of molding by use of a mold, or of an etching process, it is expensive as compared with an ordinary lens. Therefore, the method disclosed in Japanese Laid-Open Patent Application, Laid-Open No. 201697/1995, which requires diffractive optical elements of the same number as that of the illumination modes necessarily results in a very expensive projection exposure apparatus.

SUMMARY OF THE INVENTION

It is accordingly an object of the present invention to provide an illumination optical system, a projection exposure apparatus having such an illumination optical system, and/or a device manufacturing method using such a projection exposure apparatus, by which at least one of the inconveniences described above can be solved, by which a desired effective light source can be provided by a transform, and by which plural deformed illumination modes can be accomplished with the use of a diffractive optical element such that an inexpensive light intensity distribution transform is assured.

In accordance with an aspect of the present invention, there is provided an illumination optical system for illuminating a surface, to be illuminated, with the use of light from a light source, the illunination optical system comprising: a diffractive optical element for forming a desired light intensity distribution upon a predetermined plane; and an angular distribution transforming unit for transforming an angular distribution of light incident or to be incident on said diffractive optical element into a desired distribution.

In one preferred form of this aspect of the present invention, the illumination optical system may further comprise a blocking member for blocking zero-th order diffraction light produced by said diffractive optical element.

The illumination optical system may further comprise a multiple beam producing unit and a light projecting element for superposing light rays from said multiple beam producing unit one upon another on the surface to be illuminated, wherein the predetermined plane may be a light entrance surface of said multiple beam producing unit.

The illumination optical system may further comprise a blocking member for blocking zero-th order diffraction light produced by said diffractive optical element, wherein said blocking member may be disposed at or adjacent the light entrance surface of said multiple beam producing unit, at or adjacent the light exit surface of said multiple beam producing unit, or at a position optically conjugate with the same.

The diffractive optical element may be disposed at a Fourier transform plane with respect to the light entrance surface of said multiple beam producing unit.

The illumination optical system may further comprise an optical element disposed between said diffractive optical element and said multiple beam producing unit, said optical element being movable along an optical axis direction.

The illumination optical system may further comprise an internal reflection member effective to make, uniform, the light intensity distribution of the light incident on the light entrance surface thereof, wherein the light exit surface of said internal reflection member may be disposed at a position optically conjugate with the light entrance surface of said multiple beam producing unit.

The illumination optical system may further comprise an internal reflection member effective to make, uniform, the light intensity distribution of the light incident on the light entrance surface thereof, wherein said diffractive optical element may be disposed at or adjacent the light entrance surface of said internal reflection member or at a position optically conjugate with the same, and wherein said blocking member may be disposed at a Fourier transform plane with respect to the light entrance surface of said internal reflection member.

The angular distribution transforming unit may include an optical element movable along an optical axis direction, wherein, with the movement of said optical element, the angular distribution of light incident on the diffractive optical element may be changed.

The angular distribution transforming unit may include a plurality of optical elements demountably inserted into an optical path, wherein, with the selection of an optical element among said plurality of optical elements, to be present on the optical path, the angular distribution of light incident on the diffractive optical element may be changed.

The diffractive optical element may be demountably inserted into an optical path.

The blocking member may be demountably inserted into an optical path.

In accordance with another aspect of the present invention, there is provided an illumination optical system for illuminating a surface, to be illuminated, with the use of light from a light source, the illumination opitcal system comprising: a diffractive optical element for forming a desired light intensity distribution upon a predetermined plane; and a blocking member for blocking zero-th order diffraction light produced by said diffractive optical element.

In accordance with a further aspect of the present invention, there is provided an exposure apparatus, comprising: an illumination optical system for illuminating a mask, to be illuminated, with use of light from a light source, said illumination optical system including (i) a diffractive optical element for forming a desired light intensity distribution upon a predetermined plane, and (ii) an angular distribution transforming unit for transforming an angular distribution of light incident or to be incident on said diffractive optical element into a desired distribution; and a projection optical system for projecting a pattern of the mask, illuminated with light from said illumination optical system, onto a wafer.

In accordance with a yet further aspect of the present invention, there is provided an exposure apparatus, comprising: an illumination optical system for illuminating a surface, to be illuminated, with use of light from a light source, said illumination optical system including (i) a diffractive optical element for forming a desired light intensity distribution upon a predetermined plane, and (ii) a blocking member for blocking zero-th order diffraction light produced by said diffractive optical element; and a projection optical system for projecting a pattern of the mask, illuminated with light from said illumination optical system, onto a wafer.

In accordance with a still further aspect of the present invention, there is provided a device manufacturing method, comprising the steps of: applying a photosensitive material to a wafer; illuminating a mask surface, to be illuminated, by use of light from an illumination optical system, said illumination optical system including (i) a diffractive optical element for forming a desired light intensity distribution upon a predetermined plane, and (ii) a blocking member for blocking zero-th order diffraction light produced by said diffractive optical element; transferring, by use of a projection optical system, a pattern the mask onto a wafer; and developing the transferred pattern.

In accordance with a yet further aspect of the present invention, there is provided a device manufacturing method, comprising the steps of: applying a photosensitive material to a wafer; illuminating a mask surface, to be illuminated, by use of light from an illumination optical system, said illumination optical system including (i) a diffractive optical element for forming a desired light intensity distribution upon a predetermined plane, and (ii) a blocking member for blocking zero-th order diffraction light produced by said diffractive optical element; transferring, by use of a projection optical system, a pattern of the mask onto a wafer; and developing the transferred pattern.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B show a first embodiment of the present invention, wherein FIG. 1A is a front view of a zero-th order blocking plate turret and FIG. 1B is a fragmentary view of a structure of a scan type projection exposure apparatus.

DESCRIPTION OF THE PREFERRED EMBODIMENTS

In an embodiment of the present invention wherein the structure described above is applied, by changing the angle of light incident on a diffractive optical element, plural deformed illumination modes can be accomplished by use of a reduced number of diffractive optical elements. Therefore, an inexpensive light intensity distribution transforming optical system is provided. Preferably, the light intensity distribution to be transformed by a diffractive optical element may be magnified or reduced by use of a zoom optical system. This meets to many illumination modes with use of fewer diffractive optical elements, and thus, an inexpensive light intensity distribution transforming optical system is provided.

These features are based on the principle of the present invention such as follows. The principle will be described in conjunction with FIGS. 2A–2E. Here, the term "illumination plane" refers to the neighborhood of the location where an effective light source is defined. In a projection exposure appartus which uses a multiple beam producing unit such as a fly's eye lens, for example, the light entrance surface of the fly's eye lens corresponds to this.

Figure 2A:
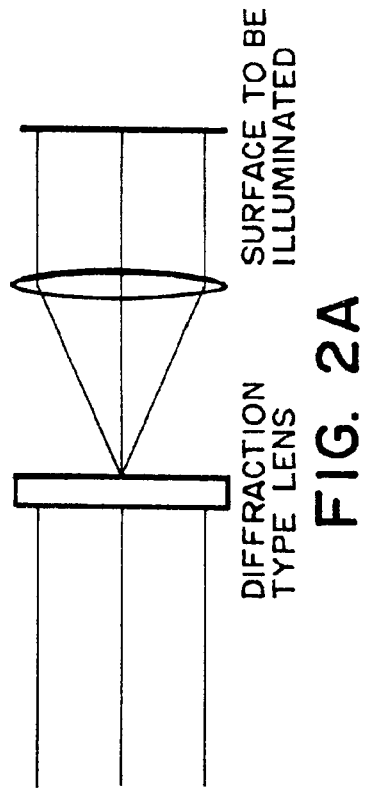
FIGS. 2A–2E are schematic views for explaining a transform of a light intensity distribution based on a diffractive optical element.
Figure 2B:
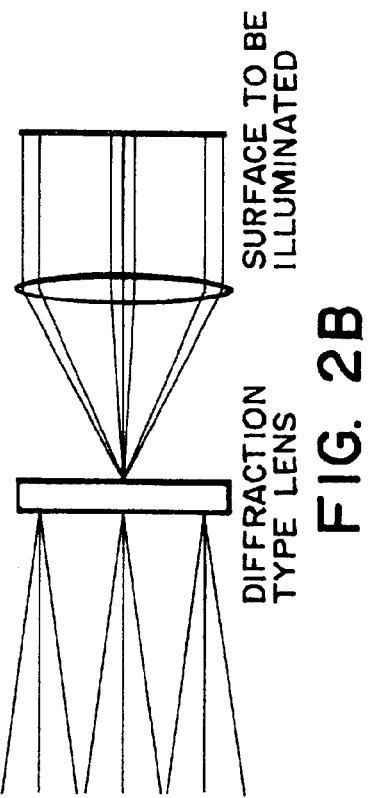
Figure 2C:
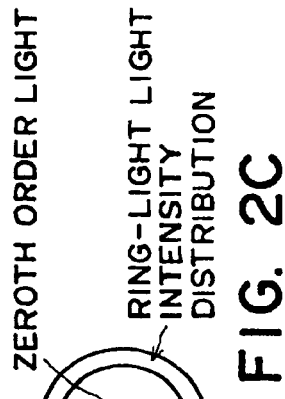

If, for example, parallel light is projected on a diffractive optical element (FIG. 2A), which is effective to produce a ring, a light intensity distribution such as shown in FIG. 2C is produced on the illumination plane. Namely, a distribution of zero-th order light at the center and a ring-like light intensity distribution are produced. This is essentially the light intensity distribution transforming method as disclosed in Japanese Laid-Open Patent Application, Laid-Open No. 201697/1995.

Figure 2D:
Figure 2E:
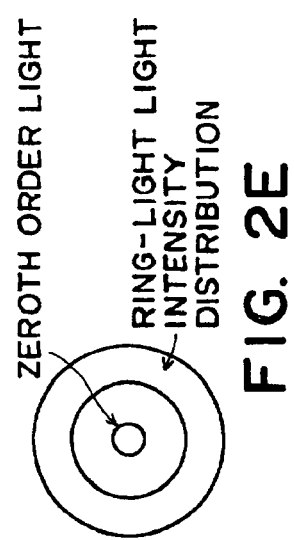
Figure 3A:
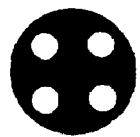
FIGS. 3A–3E are schematic views, for explaining the shapes of effective light sources.
Figure 3B:
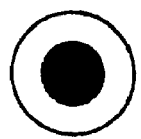
Figure 3C:
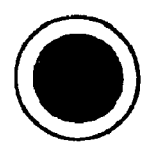
Figure 3D:
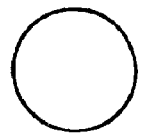
Figure 3E:
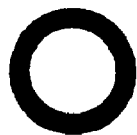

As compared therewith, FIG. 2B shows a case in which light having an angular distribution is projected on a diffractive optical element effective to produce a ring. In this case, since the advancing direction of diffraction light differs with the incidence angle, ring-like light intensity distributions are produced in relation to each of the incidence angles, respectively (FIG. 2D). In this case, therefore, generally, a light intensity based on superposition of rings defined in relation to each of the angles is produced on the illumination plane (FIG. 2E).

On the basis of the principle described above, by controlling the angle of light incident on a single diffractive optical element, which is effective to produce a ring-like light intensity distribution, the width of the ring-like shape of the light intensity distribution can be controlled. Therefore, by use of one diffractive optical element for transforming light into a ring-like light intensity distribution, it is possible to transform light into a ½ ring or a ⅔ ring, for example.

Further, by magnifying or reducing the light intensity distribution produced by a diffractive optical element, by use of a zoom optical system, the same ½ ring may be transformed into a ½ ring light intensity distribution of a different diameter, and this can be accomplished by use of only one diffractive optical element.

Further, in an embodiment of the present invention, light can be transformed into a desired effective light source by means of a blocking member for blocking the zero-th order light. This is because, when a diffractive optical element such as a BOE is used, zero-th order light is necessarily produced, and there remains a distribution of zero-th order light in addition to a desired light intensity distribution.

In an embodiment of the present invention, in consideration of it, a blocking member for blocking zero-th order light produced by a diffractive optical element may be provided, by which a desired effective light source without zero-th order light can be accomplished.

The present invention is based on the principle as described above.

Preferred embodiments of the present invention will now be described. It should be noted, however, that the present invention is not limited to these embodiments.

[Embodiment 1]

Figure 1A:
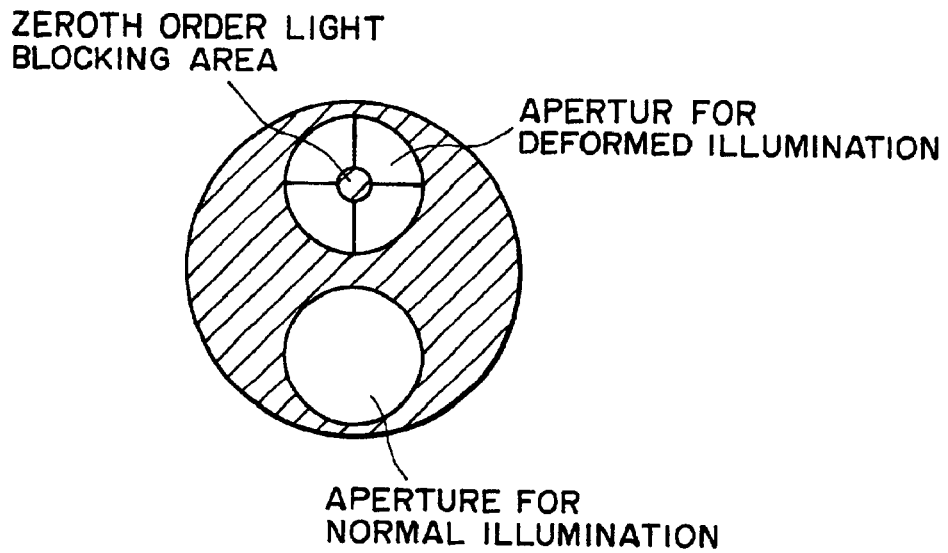
Figure 1B:
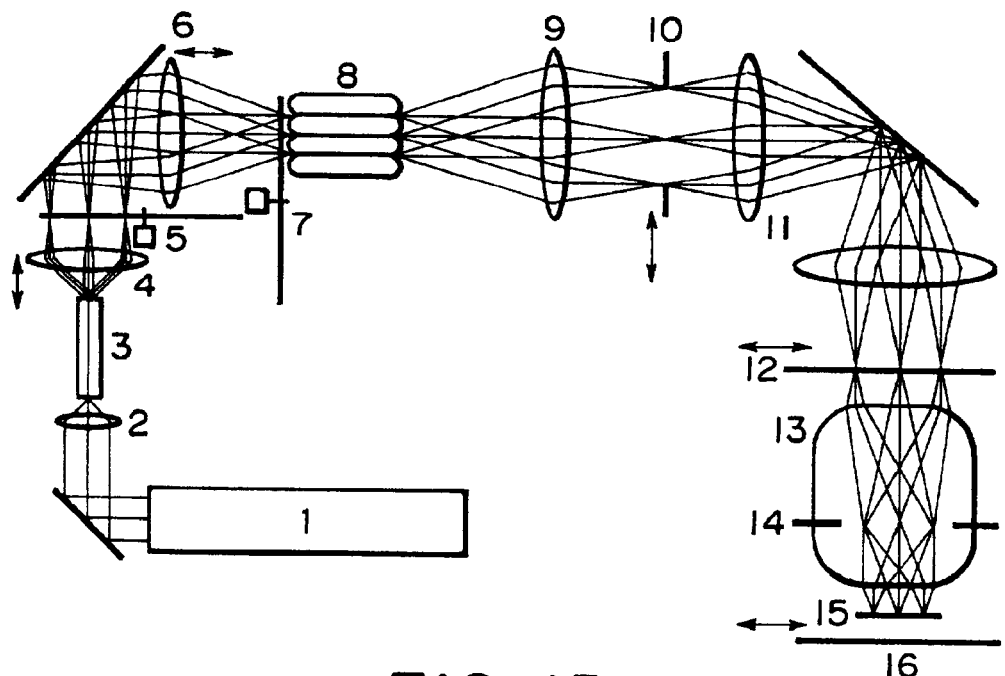

FIG. 1B shows a general structure of a first embodiment of the present invention. In this embodiment, the structure such as described above is applied to a scan type projection exposure apparatus, in which a portion of a mask 12 having a pattern formed thereon is illuminated and in which the mask 12 and a photosensitive substrate 15 are scanned in synchronism with each other while a portion of the pattern of the mask 12 is being projected onto the photosensitive substrate 15. The pattern of the mask 12 is sequentially transferred to the photosensitive substrate 15, in this manner.

Although this embodiment will be described with reference to a scanning exposure type projection exposure apparatus, as a matter of course, the present invention is applicable also to a simultaneous exposure type projection exposure apparatus.

In FIG. 1B, denoted at 1 is a light source. Currently, mainly KrF excimer lasers (wavelength 248 nm) are used. In the future, ArF excimer lasers (wavelength 193 nm) will be used. While this embodiment uses a laser light source, this embodiment is applicable also to a case wherein a divergent light source such as a high pressure Hg lamp, for example, is used.

Denoted at 2 is an input optical system for inputting the light from the light source into an internal reflection member 3 at a desired angle, such that, with the internal reflection member 3, the light intensity is made uniform. The internal reflection member 3 has a function that the light rays incident thereon are reflected plural times by its side wall, by which a light intensity distribution not being uniform on the light entrance surface of the internal reflection member is made uniform at the light exit surface thereof.

The internal reflection member 3 may comprise mirrors disposed opposed to each other, for example, or it may simply be a rod-like glass material. When a rod-like glass material is used, it should be designed to assure that, as the light rays impinge on the side surface of the rod, they are totally reflected due to the difference in refractive index between the glass material and the ambience (e.g., air).

Denoted at 4 is a collimator lens by which the position of a diffractive optical element 5 is placed in a pupil relation with the light exit surface of the internal reflection member 3. The collimator lens 4 corresponds to an angular distribution transforming unit of the present invention. It comprises a zoom lens, and the focal length is variable. It serves to change the angular distribution of light rays impinging on the diffractive optical element 5.

The diffractive optical element 5 is disposed on a turret to change the angular distribution, so that, through a collimator lens 6, a ring-like distribution or a quadrupole distribution is formed on the light entrance surface of a fly's eye lens 8 (FIGS. 3A–3E).

The diffractive optical element 5 may be a CGH (computer generated hologram), or it may be one having an effect of a fine prism. The turret also has a parallel flat plate or a slot without any optical element. For standard illumination, the light exit surface of the internal reflection member 3 can be projected on the light entrance surface of the fly's eye lens 8, while being magnified or reduced.

The collimator lens 6 is a zoom optical system having a variable focal length. It functions to change the size of the light intensity distribution formed by the diffractive optical element on the light entrance surface of the fly's eye lens.

Denoted at 7 is a light blocking member provided on a turret. It serves to block zero-th order light produced by the diffractive optical element 5. As regards the shape of this blocking member 7, any shape may be used as long as the zero-th order light can be blocked. It may have an aperture with a shape of a desired effective light source (FIG. 1A).

Denoted at 8 is a fly's eye lens, and denoted at 9 is a collimator lens. By means of this fly's eye lens 8, many light convergence points are defined on the light exit surface and, through the collimator lens 9, uniform illumination is accomplished while using the light convergence points produced by the fly's eye lens 8 as secondary light sources.

Denoted at 10 is a stop for controlling the illumination region on the surface to be illuminated. The position of the stop 10 is illuminated with a uniform illuminance distribution through the collimator lens 9, while using the light convergence points of the fly's eye lens as secondary light sources. Denoted at 11 is an imaging optical system which takes the stop 10 position as an object plane and the mask 12 position as an image plane. The uniform illuminance distribution provided at the stop 10 position is projected by the imaging optical system onto the mask 12, such that the mask 12 is illuminated with a uniform illuminance.

Denoted at 13 is a projection optical system for imaging the pattern of the mask 12 on a substrate. Denoted at 14 is a stop for controlling the numerical aperture of the projection optical system. Denoted at 15 is a substrate to which a photosensitive material is applied. It is sensitized by projecting the pattern of the mask 12 on it, and, through a development process and the like, a pattern is produced on the substrate 15.

This embodiment concerns a scan type projection exposure apparatus, and the mask 12 and the substrate 15 are scanned in synchronism with each other. Also, since the mask 12 moves, the illumination region changes with it. Thus, the stop 10 for controlling the illumination region also moves synchronously.

Denoted at 16 is a stage for performing a scan motion for scan exposure of the substrate 15 as well as a stepwise motion for moving each shot.

[Embodiment 2]

Figure 4:
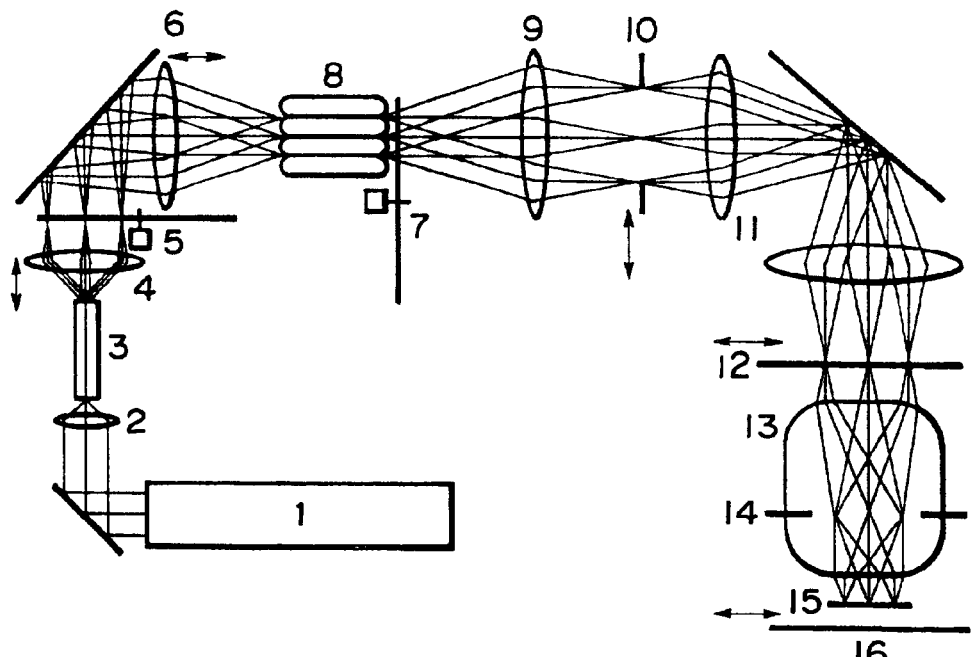
FIG. 4 is a schematic view of the structure of a second embodiment of the present invention.

FIG. 4 shows a general structure of a second embodiment of the present invention. It differs from the first embodiment in that a light blocking plate 7 for blocking zero-th order light produced by a diffractive optical element 5 is disposed at the light exit surface side of a fly's eye lens 8, not at the light entrance surface thereof. Since what is required for the blocking plate is that it blocks zero-th order light produced by the diffractive optical element 5 before the same reaches the mask 12 surface, the placement of the blocking plate may be modified further, such as at a position conjugate with the light entrance surface of the fly's eye lens, or a position conjugate with the light exit surface of a fly's eye lens, for example.

[Embodiment 3]

Figure 5:
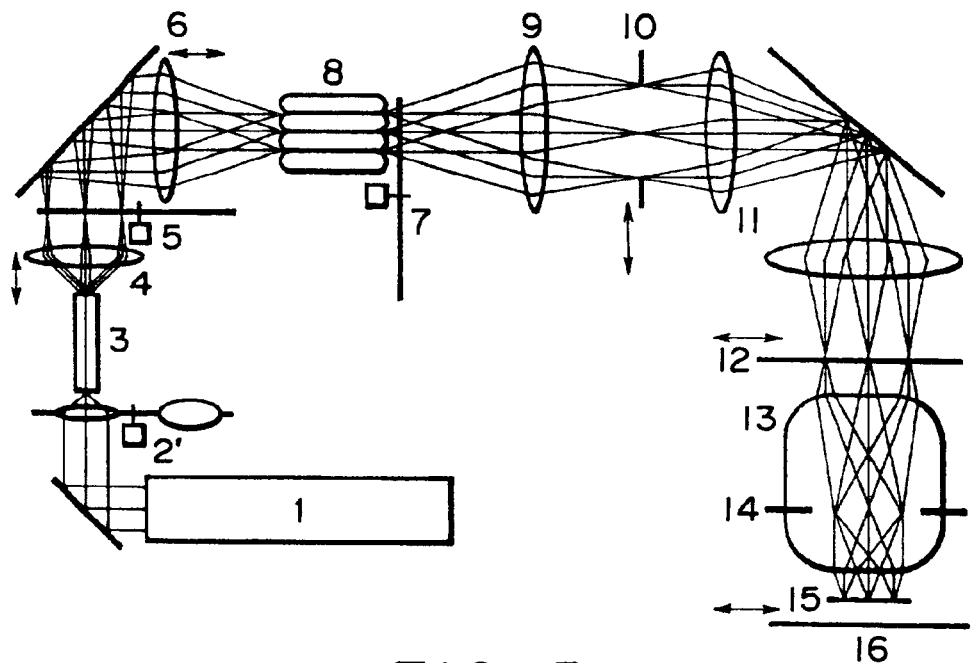
FIG. 5 is a schematic view of the structure of a third embodiment of the present invention.

FIG. 5 shows a general structure of a third embodiment of the present invention. It differs from the second embodiment in that means for changing the angular distribution of light rays incident on the diffractive optical element 5 comprises, in place of the input lens 2 of FIG. 4, a plurality of input lenses 2' having different local lengths (i.e., angular distribution transforming unit), which are mounted on a turret. As a matter of course, they may be used in combination with a zoom lens.

[Embodiment 4]

Figure 6:
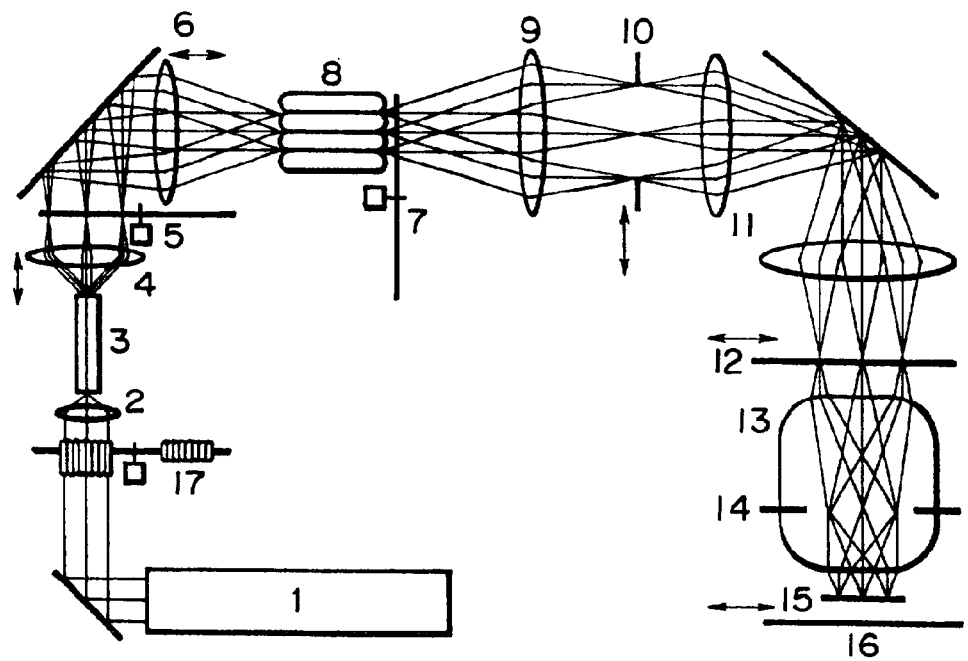
FIG. 6 is a schematic view of the structure of a fourth embodiment of the present invention.

FIG. 6 shows a general structure of a fourth embodiment of the present invention. It differs from the third embodiment in that means for changing the angular distribution of light rays incident on the diffractive optical element comprises, in place of plural input lenses having different local lengths, a plurality of fly's eye lenses 17 of different focal lengths (i.e., angular distribution transforming unit), which are mounted on a turret. As compared with the third embodiment, the uniforming effect of the internal reflection member is high. As a matter of course, they may be used in combination with a zoom lens. Further, the fly's eye lens may be replaced by a diffractive optical element having a similar function.

[Embodiment 5]

Figure 7:
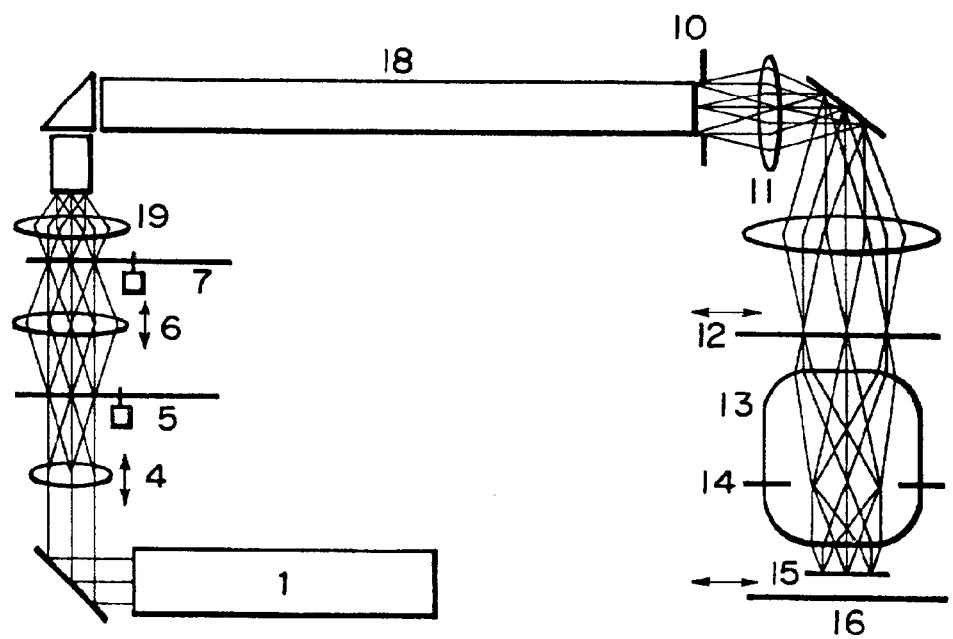
FIG. 7 is a schematic view of the structure of a fifth embodiment of the present invention.

FIG. 7 shows a general structure of a fifth embodiment of the present invention. In the fifth embodiment, the invention is applied to a scan type projection exposure apparatus which includes an illumination system wherein the light exit surface of an internal reflection member 18 is projected on the surface of a mask 12.

In the fifth embodiment, the angular distribution of illumination light upon the light entrance surface of the internal reflection member 18 corresponds to the angular distribution of illumination light upon the mask 12. Therefore, a diffractive optical element mounted on a turret 5 should be placed at a position optically conjugate with the light entrance surface of the internal reflection member 18, and also the blocking plate 7 for blocking zero-th order light should be placed at a position which is in a pupil relation with the light entrance surface of the internal reflection member.

Although, in this embodiment, the optical system for changing the angular distribution of light rays incident on the diffractive optical element 5 comprises a zoom lens 4 (i.e., angular distribution transforming unit), it may be replaced by a plurality of fly's eye lenses having different focal lengths as described hereinbefore, or a plurality of input lenses having different focal lengths.

[Embodiment 6]

Figure 8:
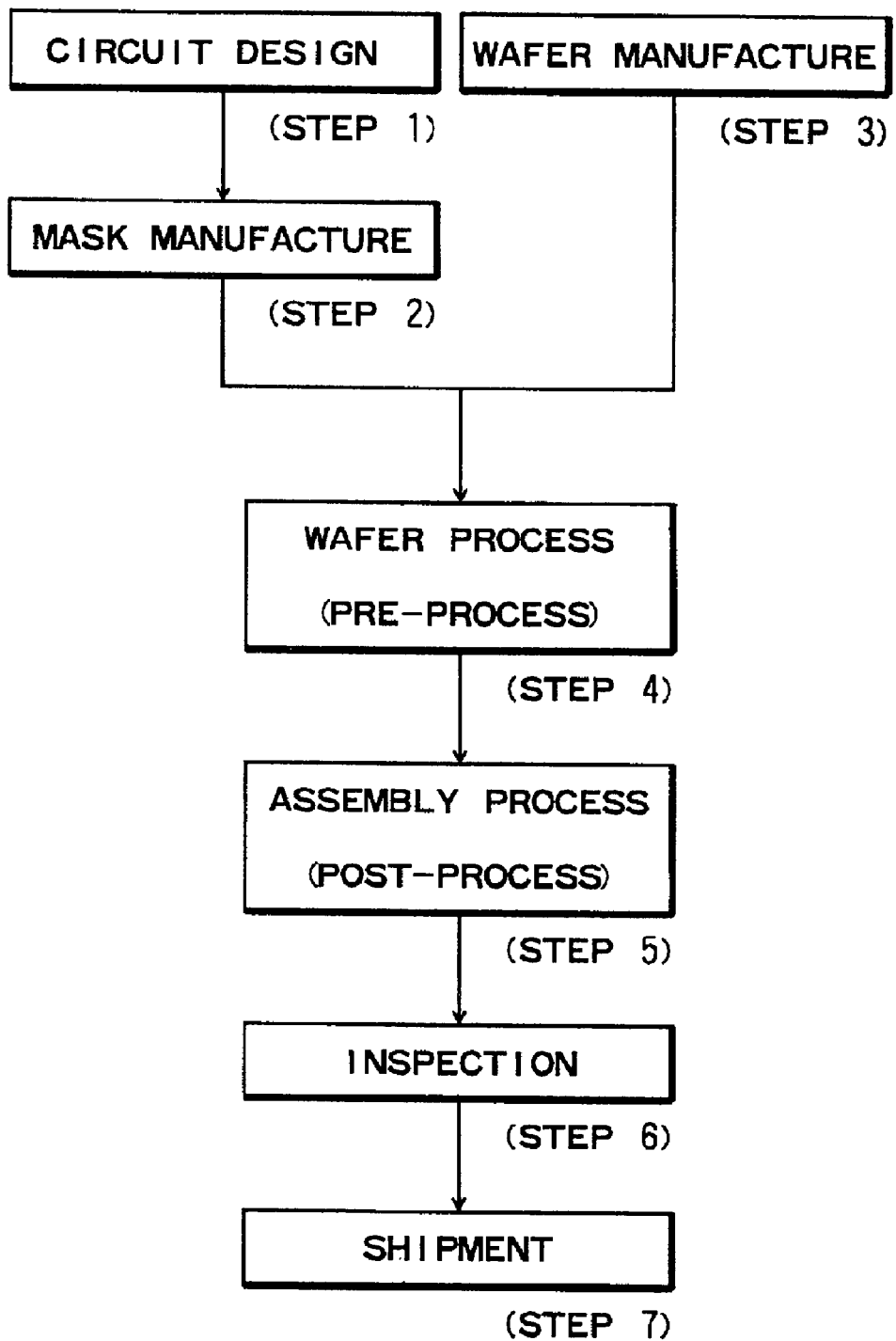
FIG. 8 is a flow chart of semiconductor device manufacturing processes, in a sixth embodiment of the present invention.
Figure 9:
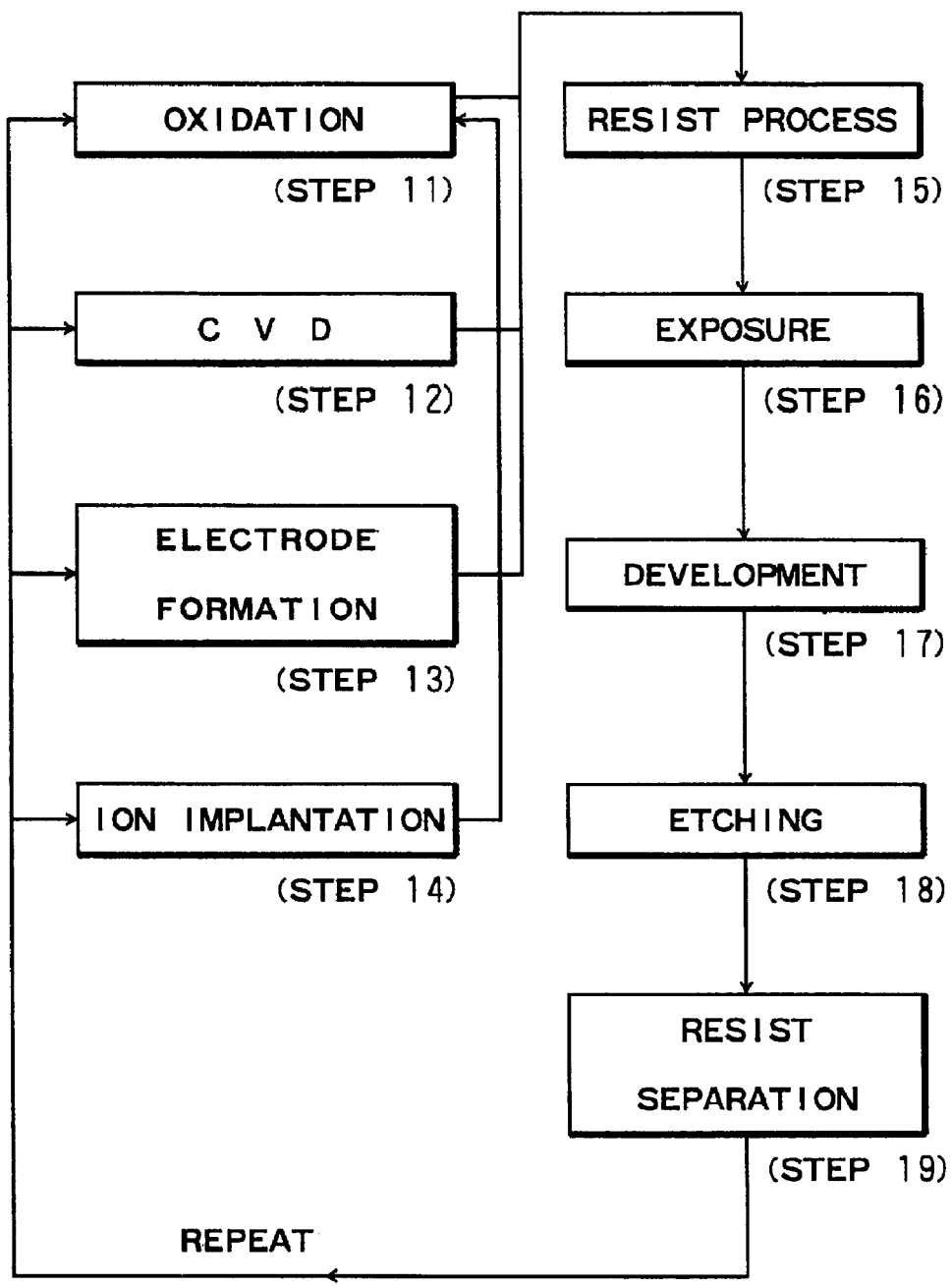
FIG. 9 is a flow chart of a wafer process, in the sixth embodiment of the present invention.

FIGS. 8 and 9 show a sixth embodiment of the present invention, in which a projection exposure apparatus as described above is applied.

FIG. 8 is a flow chart of a procedure for manufacture of microdevices such as semiconductor chips (e.g., ICs or LSIs), liquid crystal panels, or CCDs, for example, in this embodiment.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

FIG. 9 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with the manufacturing method of this embodiment, a semiconductor device can be produced in a shorter time and by use of an inexpensive and higher illuminance exposure apparatus.

In accordance with the present invention, as described hereinbefore, by changing the incidence angle of light on a diffractive optical element, plural modified illumination modes can be accomplished with a reduced number of diffractive optical elements, and an inexpensive light intensity distribution transforming optical system is assured.

Further, an optical system for transforming an angular distribution of illumination light, for illuminating a surface to be illuminated, into a desired light intensity distribution, may be constituted by at least one diffractive optical element and an optical system having at least one blocking member for blocking zero-th order light produced by the diffractive optical element. With this arrangement, a desired effective light source can be provided while the zero-th order light produced by the diffractive optical element is blocked.

While the invention has been described with reference to the structures disclosed herein, it is not confined to the details set forth and this application is intended to cover such modifications or changes as may come within the purposes of the improvements or the scope of the following claims.

What is claimed is:

1. An illumination optical system for illuminating a surface, to be illuminated, with use of light from a light source, said illumination optical system comprising:

a diffractive optical element for forming a desired light intensity distribution upon a predetermined plane;

an angular distribution transforming unit for transforming an angular distribution of light incident or to be incident on said diffractive optical element into a plurality of predetermined distributions;

a multiple beam producing unit, wherein the predetermined plane is a light entrance surface of said multiple beam producing unit; and a light projecting element for superposing light rays from said multiple beam producing unit one upon another on the surface to be illuminated.

2. An illumination optical system according to claim 1, further comprising a blocking member for blocking zero-th order diffraction light produced by said diffractive optical element.

3. An illumination optical system according to claim 1, further comprising a blocking member for blocking zero-th order diffraction light produced by said diffractive optical element, wherein said blocking member is disposed one of (i) at or adjacent to the light entrance surface of said multiple beam producing unit, (ii) at or adjacent to the light exit surface of said multiple beam producing unit, and (iii) at a position optically conjugate with the same.

4. An illumination optical system according to claim 1, wherein said diffractive optical element is disposed at a Fourier transform plane with respect to the light entrance surface of said multiple beam producing unit.

5. An illumination optical system according to claim 1, further comprising an optical element disposed between said diffractive optical element and said multiple beam producing unit, said optical element being movable along an optical axis direction.

6. An illumination optical system according to claim 1, further comprising an internal reflection member effective to make uniform the light intensity distribution of the light incident on the light entrance surface thereof, wherein the light exit surface of said internal reflection member is disposed at a position optically conjugate with the light entrance surface of said multiple beam producing unit.

7. An illumination optical system according to claim 1, wherein said diffractive optical element is demountably inserted into an optical path.

8. An illumination optical system accordinig to claim 1, wherein said blocking member is demountably inserted into an optical path.

9. An illumination optical system according to claim 1, wherein said angular distribution transforming unit includes an optical element movable along an optical axis direction, wherein, with the movement of said optical element, the angular distribution of light incident on the diffractive optical element is changed.

10. An illumination optical system according to claim 1, wherein said angular distribution transforming unit includes a plurality of optical elements demountably inserted into an optical path, wherein, with the selection of an optical element among said plurality of optical elements, to be present on the optical path, the angular distribution of light incident on the diffractive optical element is changed.

11. An illumination optical system for illuminating a surface, to be illuminated, with use of light from a light source, said illumination optical system comprising:
   a diffractive optical element for forming a desired light intensity distribution upon a predetermined plane;
   an angular distribution transforming unit for transforming an angular distribution of light incident or to be incident on said diffractive optical element into a desired distribution, and
   an internal reflection member effective to make uniform the light intensity distribution of the light incident on the light entrance surface thereof, wherein the light entrance surface of said internal reflection member and the diffractive optical element are optically conjugate with each other, light from said diffractive optical element is incident on the light entrance surface of said internal reflection member, and the surface to be illuminated is illuminated with light from said internal reflection member.

12. An illumination optical system according to claim 11, wherein said angular distribution transforming unit transforms the angular distribution into a plurality of predetermined distributions.

13. An illumination optical system according to claim 12, wherein said angular distribution transforming unit includes an optical element movable along an optical axis direction, and the angular distribution of light incident on the diffractive optical element is changed in accordance with the movement of said optical element.

14. An illumination optical system according to claim 12, wherein said angular distribution transforming unit includes a plurality of optical elements selectively and demountably placed on an optical path, and the angular distribution of light incident on the diffractive optical element is changed in accordance with selection of an optical element of said plurality of optical elements to be presented on the optical path.

15. An exposure apparatus comprising:
   an illumination optical system for illuminating a mask, to be illuminated, with use of light from a light source, said illumination optical system including (i) a diffractive optical element for forming a desired light intensity distribution upon a predetermined plane, (ii) an angular distribution transforming unit for transforming an angular distribution of light incident or to be incident on said diffractive optical element into a plurality of predetermined distributions, (iii) a multiple beam producing unit, wherein the predetermined plane is a light entrance surface of said multiple beam producing unit, and (iv) a light projecting element for superposing light rays from said multiple beam producing unit upon one another on the surface to be illuminated; and
   a projection optical system for projecting a pattern of the mask, illuminated with light from said illumination optical system, onto a wafer.

16. A device manufacturing method, comprising the steps of:
   applying a photosensitive material onto a wafer;
   illuminating a mask surface, to be illuminated, by use of light from an illumination optical system, said illumination optical system including (i) a diffractive optical element for forming a desired light intensity distribution upon a predetermined plane, (ii) an angular distribution transforming unit for transforming an angular distribution of light incident or to be incident on said diffractive optical element into a plurality of predetermined distributions, (iii) a multiple beam producing unit, wherein the predetermined plane is a light entrance surface of said multiple beam producing unit, and (iv) a light projecting element for superposing light rays from said multiple beam producing unit upon one another on the surface to be illuminated;
   transferring, by use of a projection optical system, a pattern of the mask onto a wafer; and
   developing the transferred pattern.

17. A projection exposure apparatus comprising:
   an illumination optical system for illuminating a mask, to be illuminated, with use of light from a light source, said illumination optical system including (i) a diffractive optical element for forming a desired light intensity distribution upon a predetermined plane, (ii) an angular distribution transforming unit for transforming an angular distribution of light incident or to be incident on said diffractive optical element into a desired distribution, and (iii) an internal reflection member effective to make uniform the light intensity distribution of the light incident on the light entrance surface thereof, wherein the light entrance surface of said internal reflection member and the diffractive optical element are optically conjugate with each other, light from said diffractive optical element is incident on the light entrance surface of said internal reflection member, and the surface to be illuminated is illuminated with light from said internal reflection member; and
   a projection optical system for projecting a pattern of the mask illuminated with light from said illumination optical system, onto a wafer.

18. A device manufacturing method comprising the steps of:
   applying a photosensitive material onto a wafer;
   illuminating a mask surface, to be illuminated, by use of light from an illumination system, said illumination optical system including (i) a diffractive optical element for forming a desired light intensity distribution upon a predetermined plane, (ii) a angular distribution transforming unit for transforming an angular distribution of light incident or to be incident on said diffractive optical element into a desired distribution, and (iii) an internal reflection member effective to make uniform the light intensity distribution of the light incident on the light entrance surface thereof, wherein the light entrance surface of said internal reflection member and the diffractive optical element are optically conjugate with each other, light from said diffractive optical element is incident on the light entrance surface of said internal reflection member, and the surface to be illuminated is illuminated with light from said internal reflection member;
   transferring, by use of a projection optical system, a pattern of the mask onto a wafer; and
   developing the transferred pattern.

* * * * *

UNITED STATES PATENT AND TRADEMARK OFFICE
CERTIFICATE OF CORRECTION

PATENT NO. : 6,903,801 B2
DATED : June 7, 2005
INVENTOR(S) : Kenichiro Mori

It is certified that error appears in the above-identified patent and that said Letters Patent is hereby corrected as shown below:

Title page,
Item [57], ABSTRACT, delete and insert:
-- An illumination optical system for illuminating a surface, to be illuminated, with use of light from a light source. The illumination optical system includes a diffractive optical element for forming a desired light intensity distribution upon a predetermined plane, an angular distribution transforming unit for transforming an angular distribution of light incident or to be incident on the diffractive optical element into a desired distribution, the angular distribution transforming unit also being operable to change the desired distribution, a multiple beam producing unit, wherein the predetermined plate is a light entrance surface of the multiple beam producing unit, and a light projecting element for superposing light rays from the multiple beam producing unit one another on the surface to be illuminated. --.

Drawings,
Sheet 1 of 7, FIG. 1A, "APERTUR" should read -- APERTURE --.

Column 1,
Lines 24 and 64, "NO." should read -- No. --.

Column 4,
Line 23, "opitcal" should read -- optical --.

Signed and Sealed this

Seventh Day of February, 2006

JON W. DUDAS
*Director of the United States Patent and Trademark Office*